(12) United States Patent
Taranta, II (10) Patent No.: US 9,009,569 B2
(45) Date of Patent: Apr. 14, 2015

(54) DETECTION AND CORRECTION OF SILENT DATA CORRUPTION

(75) Inventor: Eugene M. Taranta, II, Casselberry, FL (US)

(73) Assignee: Xyratex Technology Limited, Havant, Hampshire (GB)

( * ) Notice: Subject to any disclaimer, the term of this patent is extended or adjusted under 35 U.S.C. 154(b) by 906 days.

(21) Appl. No.: 12/906,770

(22) Filed: Oct. 18, 2010

(65) Prior Publication Data

US 2012/0096329 A1 Apr. 19, 2012

(51) Int. Cl.
*G06F 11/00* (2006.01)
*G06F 11/10* (2006.01)
*H03M 13/09* (2006.01)

(52) U.S. Cl.
CPC .... *G06F 11/1076* (2013.01); *G06F 2211/1057* (2013.01); *H03M 13/09* (2013.01)

(58) Field of Classification Search
CPC .............. G06F 11/1076; G06F 11/108; G06F 11/1044; G06F 3/064; G06F 11/08; G06F 11/10; G06F 11/1016; G06F 2211/1057
USPC .......................... 714/6.24, 763, 764, 768, 784
See application file for complete search history.

(56) References Cited

U.S. PATENT DOCUMENTS

| | | | | |
|---|---|---|---|---|
| 5,613,088 A * | 3/1997 | Achiwa et al. | ................ | 711/155 |
| 6,467,060 B1 * | 10/2002 | Malakapalli et al. | ......... | 714/758 |
| 6,952,797 B1 * | 10/2005 | Kahn et al. | .................... | 714/770 |
| 7,055,082 B2 * | 5/2006 | Mori et al. | .................... | 714/768 |
| 7,174,485 B2 * | 2/2007 | Silvus | ............................ | 714/701 |
| 7,549,089 B1 * | 6/2009 | Kimmel et al. | .................. | 714/42 |
| 7,689,877 B2 * | 3/2010 | Moore et al. | .................. | 714/710 |
| 7,716,519 B2 * | 5/2010 | Moore et al. | .................. | 714/6.22 |
| 7,873,878 B2 * | 1/2011 | Belluomini et al. | ............ | 714/52 |
| 8,359,524 B2 * | 1/2013 | Pruthi | ........................... | 714/769 |
| 2004/0103360 A1 * | 5/2004 | Mori et al. | .................... | 714/768 |
| 2006/0015769 A1 * | 1/2006 | Ikeuchi et al. | .................... | 714/5 |
| 2007/0011580 A1 * | 1/2007 | Noda et al. | .................... | 714/763 |

OTHER PUBLICATIONS

Patterson, et al., "A Case for Redundant Arrays of Inexpensive Disks (RAID)", ACM, 1988, pp. 109-116.

* cited by examiner

*Primary Examiner* — Bryce Bonzo
*Assistant Examiner* — Elmira Mehrmanesh
(74) *Attorney, Agent, or Firm* — Hall Estill Attorneys at Law (57) ABSTRACT

There is provided a method of writing data to a sector of a storage device, the sector comprising a data field and a protection information field and having identifying information identifying the location of said sector. The method comprises providing data to be written to an intended sector, generating, for said intended sector, a message comprising the data and the identifying information of said intended sector and performing, on said message, error correcting encoding to generate a codeword. The codeword comprises the message and parity information generated from said error correcting coding. The data can then be written to the data field of the sector, and the parity information can be written to said protection information field of the sector.

25 Claims, 8 Drawing Sheets

DETECTION AND CORRECTION OF SILENT DATA CORRUPTION

The present invention relates to a method of, and apparatus for, detection and correction of silent data corruption.

Data integrity is a core requirement for a reliable storage system. The ability to prevent and, if necessary, identify and correct data errors and corruptions is essential for operation of storage systems ranging from a simple hard disk drive up to large mainframe storage arrays.

A typical hard disk drive comprises a number of addressable units, known as sectors. A sector is the smallest externally addressable portion of a hard disk drive. Each sector typically comprises 512 bytes of usable data. However, recent developments under the general term "advanced format" sectors enable support of sector sizes up to 4 k bytes. When data is written to a hard disk drive, it is usually written as a block of data, which comprises a plurality of contiguous sectors.

A hard disk drive is an electro-mechanical device which may be prone to errors and or damage. Therefore, it is important to detect and correct errors which occur on the hard disk drive during use. Commonly, hard disk drives set aside a portion of the available storage in each sector for the storage of error correcting codes (ECCs). This data is also known as protection information. The ECC can be used to detect corrupted or damaged data and, in many cases, such errors are recoverable through use of the ECC. However, for many cases such as enterprise storage architectures, the risks of such errors occurring are required to be reduced further.

One approach to improve the reliability of a hard disk drive storage system is to employ redundant arrays of inexpensive disk (RAID). Indeed, RAID arrays are the primary storage architecture for large, networked computer storage systems.

The RAID architecture was first disclosed in "A Case for Redundant Arrays of Inexpensive Disks (RAID)", Patterson, Gibson, and Katz (University of California, Berkeley). RAID architecture combines multiple small, inexpensive disk drives into an array of disk drives that yields performance exceeding that of a single large drive.

There are a number of different RAID architectures, designated as RAID-1 through RAID-6. Each architecture offers disk fault-tolerance and offers different trade-offs in terms of features and performance. In addition to the different architectures, a non-redundant array of disk drives is referred to as a RAID-0 array. RAID controllers provide data integrity through redundant data mechanisms, high speed through streamlined algorithms, and accessibility to stored data for users and administrators.

RAID architecture provides data redundancy in two basic forms: mirroring (RAID 1) and parity (RAID 3, 4, 5 and 6). The implementation of mirroring in RAID 1 architectures involves creating an identical image of the data on a primary disk on a secondary disk. The contents of the primary and secondary disks in the array are identical. RAID 1 architecture requires at least two drives and has increased reliability when compared to a single disk. Since each disk contains a complete copy of the data, and can be independently addressed, reliability is increased by a factor equal to the power of the number of independent mirrored disks, i.e. in a two disk arrangement, reliability is increased by a factor of four.

RAID 3, 4, 5, or 6 architectures generally utilise three or more disks of identical capacity. In these architectures, two or more of the disks are utilised for reading/writing of data and one or more of the disks store parity information. Data interleaving across the disks is usually in the form of data "striping" in which the data to be stored is broken down into blocks called "stripe units". The "stripe units" are then distributed across the disks.

Therefore, should one of the disks in a RAID group fail or become corrupted, the missing data can be recreated from the data on the other disks. The data may be reconstructed through the use of the redundant "stripe units" stored on the remaining disks. However, RAID architectures utilising parity configurations need to generate and write parity information during a write operation. This may reduce the performance of the system.

However, even in a multiple redundant system such as a RAID array, certain types of errors and corruptions cannot be detected or reported by the RAID hardware and associated controllers. This class of errors is known as silent data corruption.

A number of errors and corruptions fall into the category of silent data corruption. One such error is a misdirected write. This is a situation where a block of data which is supposed to be written to a first location is actually written to a second, incorrect, location. In this case, the system will not return a disk error because there has not, technically, been any corruption or hard drive error. However, on a data integrity level, the data at the second location has been overwritten and lost, and old data is still present at the first location. These errors remain undetected by the RAID system.

A misdirected read can also cause corruptions. A misdirected read is where data intended to be read from a first location is actually read from a second location. In this situation, parity corruption can occur due to read-modify-write (RMW) operations. Consequently, missing drive data may be rebuilt incorrectly.

A further silent data corruption which can occur is a torn write. This situation occurs where only a part of a block of data intended to be written to a particular location is actually written. Therefore, the data location comprises part of the new data and part of the old data. Such a corruption is, again, not detected by the RAID system.

Additionally, data is not always protected by ECC or CRC (cyclic redundancy check) systems. Therefore, such data can become corrupted when being passed from hardware such as the memory and central processing unit (CPU), via hardware adapters and RAID controllers. Again, such an error will not be flagged by the RAID system.

When silent data corruption has occurred in a RAID system, a further problem of parity pollution may occur. This is when parity information is calculated from (unknowingly) corrupt data. In this case, the parity cannot be used to correct the corruption and restore the original, non-corrupt, data.

Certain RAID systems (for example, RAID 6 systems) can be configured to detect and correct such errors. However, in order to do this, a full stripe read is required for each sub stripe access. This requires significant system resources and time.

Therefore, known storage systems suffer from a technical problem that silent data corruptions cannot be detected reliably and without placing excessive demands on system resources. There also exists a need to provide a method and system which is able to correct user data that is not protected by ECC for all RAID levels with requiring a full stripe read, and which enables misdirected write to be detected and corrected.

According to a first aspect of the present invention, there is provided a method of writing data to a sector of a storage device, the sector comprising a data field and a protection information field and having identifying information identifying the location of said sector, the method comprising: providing data to be written to an intended sector; generating, for said intended sector, a message comprising the data and the identifying information of said intended sector; performing, on said message, error correcting encoding to generate a codeword, said codeword comprising said message and parity information generated from said error correcting coding; writing said data to the data field of the sector; and writing said parity information to said protection information field of the sector.

By providing such a method, parity information can be generated from a message comprising both actual (user) data and the intended destination address of that data. Consequently, should the data then subsequently be sent to the wrong address, when the data is read, the parity information will show that the data is in the incorrect location.

In one arrangement, said identifying information comprises a device identifier address and a sector logical address.

In one embodiment, said error correcting coding comprises Reed-Solomon encoding.

In a variation, the codeword comprises a plurality of symbols relating to user data, a plurality of symbols relating to identifying information of said intended sector and a plurality of symbols relating to parity information.

In a variation, said codeword comprises N-bit symbols, where N is greater than 8. In a further variation, said codeword comprises 9-bit symbols.

According to a second aspect of the present invention, there is provided a method of reading data from a sector of a storage device, the sector comprising a data field and a protection information field and having identifying information identifying the location of said sector, the method comprising: executing a read request for reading of data from a sector having specified identifying information; reading data from the data field of said sector; generating a message comprising said data and the identifying information of said read sector; reading parity information from the protection information field of said sector; generating a codeword comprising said message and parity information; performing, on said codeword, error correcting decoding such that said codeword is checked for errors.

In one embodiment, said identifying information comprises a device identifier address and a sector logical address.

In one embodiment, said error correcting coding comprises Reed-Solomon encoding.

In one embodiment, wherein the codeword comprises a plurality of symbols relating to user data, a plurality of symbols relating to identifying information of said intended sector and a plurality of symbols relating to parity information.

In a variation, said codeword comprises N-bit symbols, where N is greater than 8. In a further variation, said codeword comprises 9-bit symbols.

In one embodiment, if, at said step of decoding, one or more errors in the data field of said message is detected, the method further comprises: correcting said data in said data field of said sector.

In one embodiment, if, at said step of decoding, one or more errors in the identifying information of said message is detected, the method further comprises: correcting said identifying information; and writing said data in said data field of said sector having said correct identifying information.

According to a third aspect of the invention, there is provided a controller operable to writing data to a sector of a storage device, the sector comprising a data field and a protection information field and having identifying information identifying the location of said sector, the controller being further operable to: provide data to be written to an intended sector; generate, for said intended sector, a message comprising the data and the identifying information of said intended sector; perform, on said message, error correcting encoding to generate a codeword, said codeword comprising said message and parity information generated from said error correcting coding; write said data to the data field of the sector; and write said parity information to said protection information field of the sector.

In one embodiment, said identifying information comprises a device identifier address and a sector logical address.

In one embodiment, said error correcting coding comprises Reed-Solomon encoding.

In one embodiment, the codeword comprises a plurality of symbols relating to user data, a plurality of symbols relating to identifying information of said intended sector and a plurality of symbols relating to parity information.

In a variation, said codeword comprises N-bit symbols, where N is greater than 8. In a further variation, said codeword comprises 9-bit symbols.

In one embodiment, the controller is in the form of a RAID controller.

In one embodiment, the RAID controller is implemented in either hardware or software.

According to a fourth aspect of the present invention, there is provided a controller operable to read data from a sector of a storage device, the sector comprising a data field and a protection information field and having identifying information identifying the location of said sector, the controller being further operable to: execute a read request for reading of data from a sector having specified identifying information; read data from the data field of said sector; generate a message comprising said data and the identifying information of said read sector; read parity information from the protection information field of said sector; generate a codeword comprising said message and parity information; perform, on said codeword, error correcting decoding; and check said codeword for errors.

In one embodiment, said identifying information comprises a device identifier address and a sector logical address.

In one embodiment, said error correcting coding comprises Reed-Solomon encoding.

In one embodiment, the codeword comprises a plurality of symbols relating to user data, a plurality of symbols relating to identifying information of said intended sector and a plurality of symbols relating to parity information.

In a variation, said codeword comprises N-bit symbols, where N is greater than 8. In a further variation, said codeword comprises 9-bit symbols.

In one embodiment, the controller is further operable to: correct said data in said data field of said sector if one or more errors in the data field of said message is detected.

In one embodiment, the controller is further operable to: correct said identifying information; and write said data in said data field of said sector having said correct identifying information if one or more errors in the identifying information of said message is detected.

According to a fifth aspect of the invention, there is provided a data storage apparatus comprising at least one storage device and the controller of the third or fourth aspects.

According to a sixth aspect of the present invention, there is provided a computer program product executable by a programmable processing apparatus, comprising one or more software portions for performing the steps of the first and/or second aspects.

According to a seventh aspect of the present invention, there is provided a computer usable storage medium having a computer program product according to the sixth aspect stored thereon.

Embodiments of the present invention will now be described in detail with reference to the accompanying drawings, in which.

Figure 1:
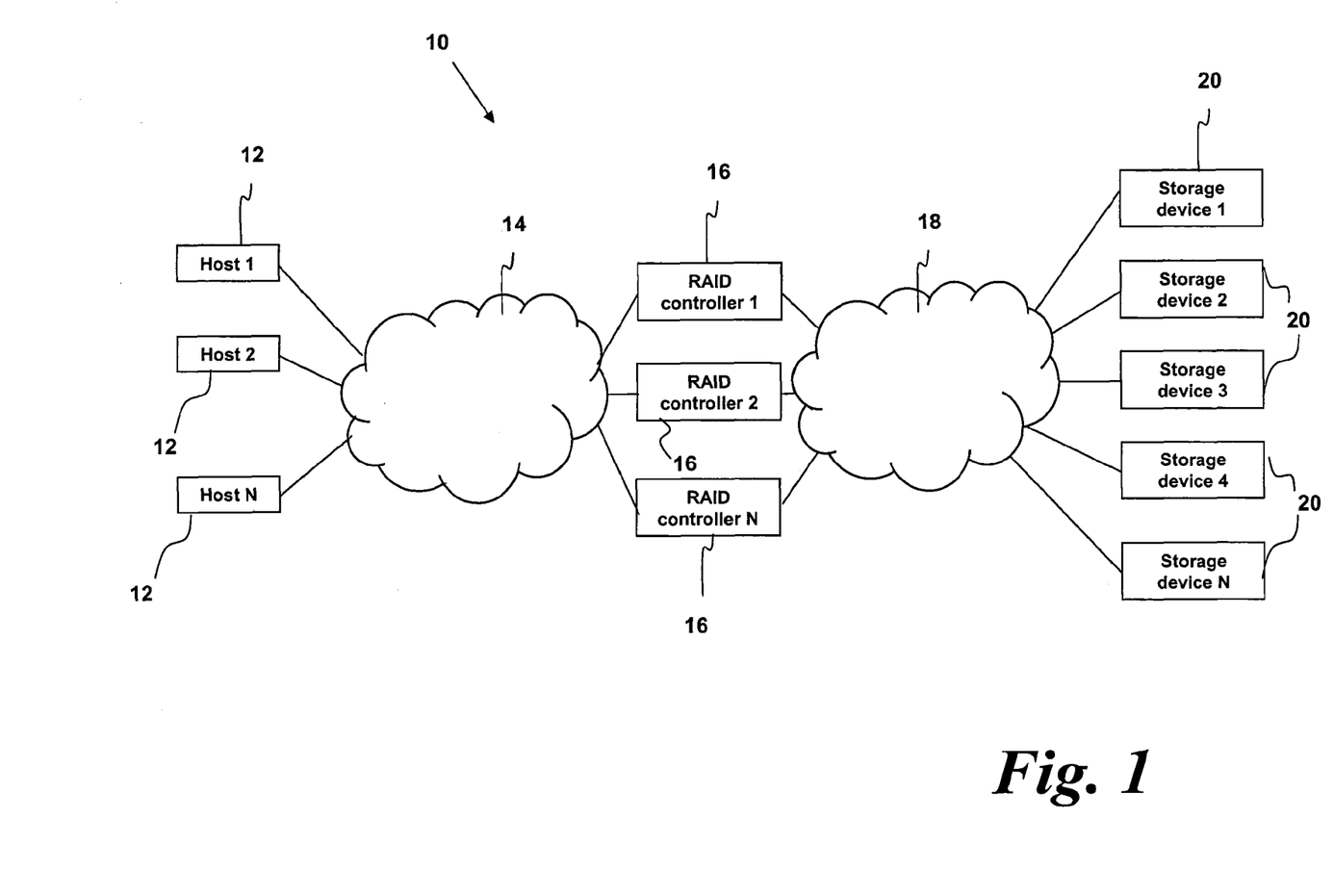
FIG. 1 is a schematic diagram of a networked storage resource.

FIG. 1 shows a schematic illustration of a networked storage resource 10 in which the present invention may be used. The networked storage resource 10 comprises a plurality of hosts 12. The hosts 12 are representative of any computer systems or terminals that are operable to communicate over a network. Any number of hosts 12 may be provided; N hosts 12 are shown in FIG. 1, where N is an integer value.

The hosts 12 are connected to a first communication network 14 which couples the hosts 12 to a plurality of RAID controllers 16. The communication network 14 may take any suitable form, and may comprise any form of electronic network that uses a communication protocol; for example, a local network such as a LAN or Ethernet, or any other suitable network such as a mobile network or the interne.

The RAID controllers 16 are connected through device ports (not shown) to a second communication network 18, which is also connected to a plurality of storage devices 20. The RAID controllers 16 may comprise any storage controller devices that process commands from the hosts 12 and, based on those commands, control the storage devices 20. RAID architecture combines a multiplicity of small, inexpensive disk drives into an array of disk drives that yields performance that can exceed that of a single large drive. This arrangement enables high speed access because different parts of a file can be read from different devices simultaneously, improving access speed and bandwidth. Additionally, each storage device 20 comprising a RAID array of devices appears to the hosts 12 as a single logical storage unit (LSU) or drive.

The operation of the RAID controllers 16 may be set at the Application Programming Interface (API) level. Typically, Original Equipment Manufactures (OEMs) provide RAID networks to end users for network storage. OEMs generally customise a RAID network and tune the network performance through an API.

Any number of RAID controllers 16 may be provided, and N RAID controllers 16 (where N is an integer) are shown in FIG. 1. Any number of storage devices 20 may be provided; in FIG. 1, N storage devices 20 are shown, where N is any integer value.

The second communication network 18 may comprise any suitable type of storage controller network which is able to connect the RAID controllers 16 to the storage devices 20. The second communication network 18 may take the form of, for example, a SCSI network, an iSCSI network or fibre channel.

The storage devices 20 may take any suitable form; for example, tape drives, disk drives, non-volatile memory, or solid state devices. Although most RAID architectures use hard disk drives as the main storage devices, it will be clear to the person skilled in the art that the embodiments described herein apply to any type of suitable storage device. More than one drive may form a storage device 20; for example, a RAID array of drives may form a single storage device 20. The skilled person will be readily aware that the above features of the present embodiment could be implemented in a variety of suitable configurations and arrangements.

The RAID controllers 16 and storage devices 20 also provide data redundancy. The RAID controllers 16 provide data integrity through a built-in redundancy which includes data mirroring. The RAID controllers 16 are arranged such that, should one of the drives in a group forming a RAID array fail or become corrupted, the missing data can be recreated from the data on the other drives. The data may be reconstructed through the use of data mirroring. In the case of a disk rebuild operation, this data is written to a new replacement drive that is designated by the respective RAID controller 16.

Figure 2:
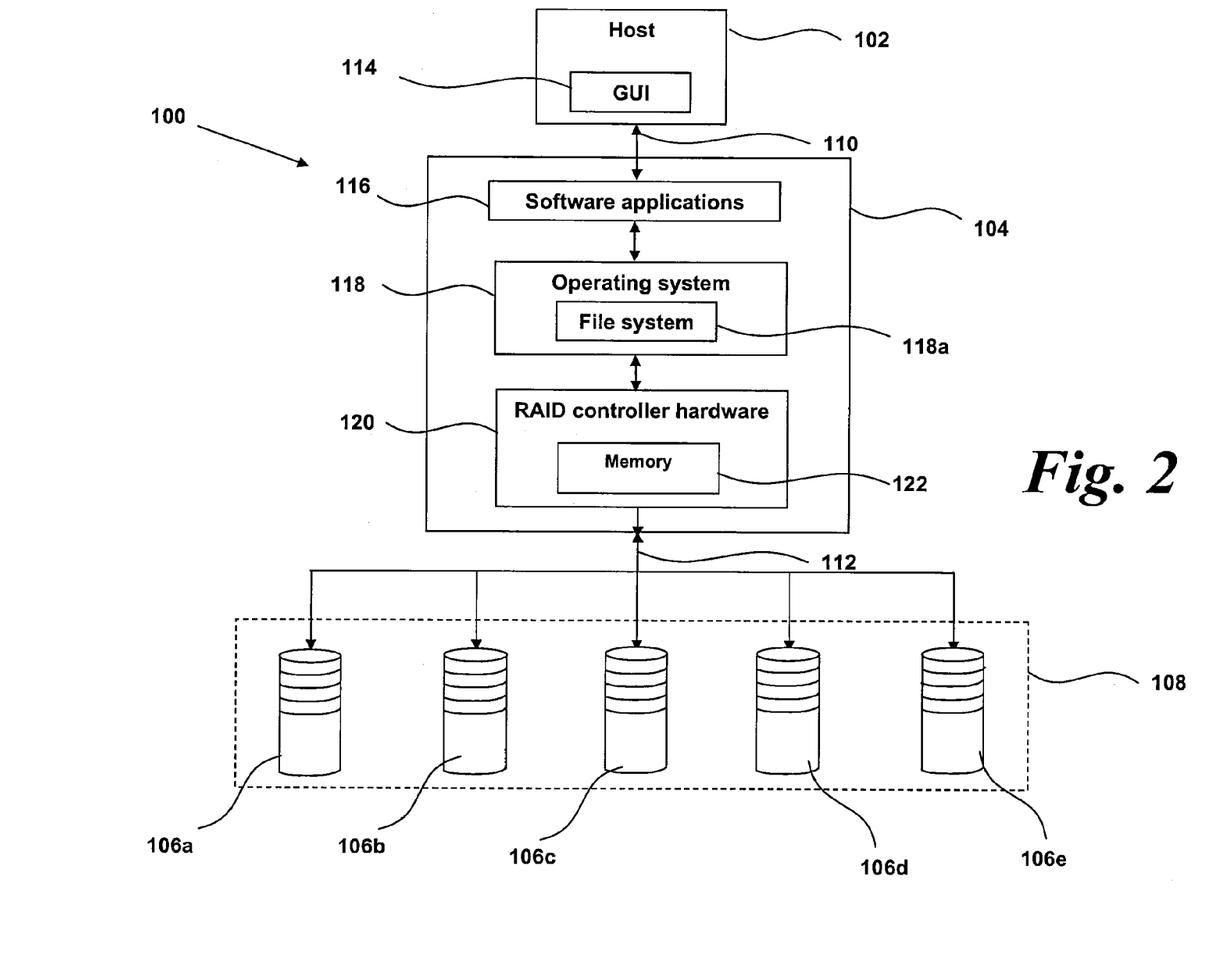
FIG. 2 is a schematic diagram showing a RAID controller of an embodiment of the present invention.

FIG. 2 shows a schematic diagram of an embodiment of the present invention. A storage resource 100 comprises a host 102, a RAID controller 104, and storage devices 106a, 106b, 106c, 106d and 106e which, together, form part of a RAID 6 array 108.

The host 102 is connected to the RAID controller 104 through a communication network 110 such as an Ethernet and the RAID controller 104 is, in turn, connected to the storage devices 106a-e via a storage network 112 such as an iSCSI network.

The host 102 comprises a general purpose computer (PC) which is operated by a user and which has access to the storage resource 100. A graphical user interface (GUI) 114 is run on the host 102. The GUI 114 is a software application which acts as a user interface for a user of the host 102.

The RAID controller 104 comprises a software application layer 116, an operating system 118 and RAID controller hardware 120. The software application layer 116 comprises software applications including the algorithms and logic necessary for the initialisation and run-time operation of the RAID controller 104. The software application layer 116 includes software functional blocks such as a system manager for fault management, task scheduling and power management. The software application layer 116 also receives commands from the host 102 (e.g., assigning new volumes, read/write commands) and executes those commands. Commands that cannot be processed (because of lack of space available, for example) are returned as error messages to the user of the host 102.

The operating system 118 utilises an industry-standard software platform such as, for example, Linux, upon which the software applications forming part of the software application layer 116 can run. The operating system 118 comprises a file system 118a which enables the RAID controller 104 to store and transfer files and interprets the data stored on the primary and secondary drives into, for example, files and directories for use by the operating system 118.

The RAID controller hardware 120 is the physical processor platform of the RAID controller 104 that executes the software applications in the software application layer 116. The RAID controller hardware 120 comprises a microprocessor, memory 122, and all other electronic devices necessary for RAID control of the storage devices 106a-e.

Figure 3:
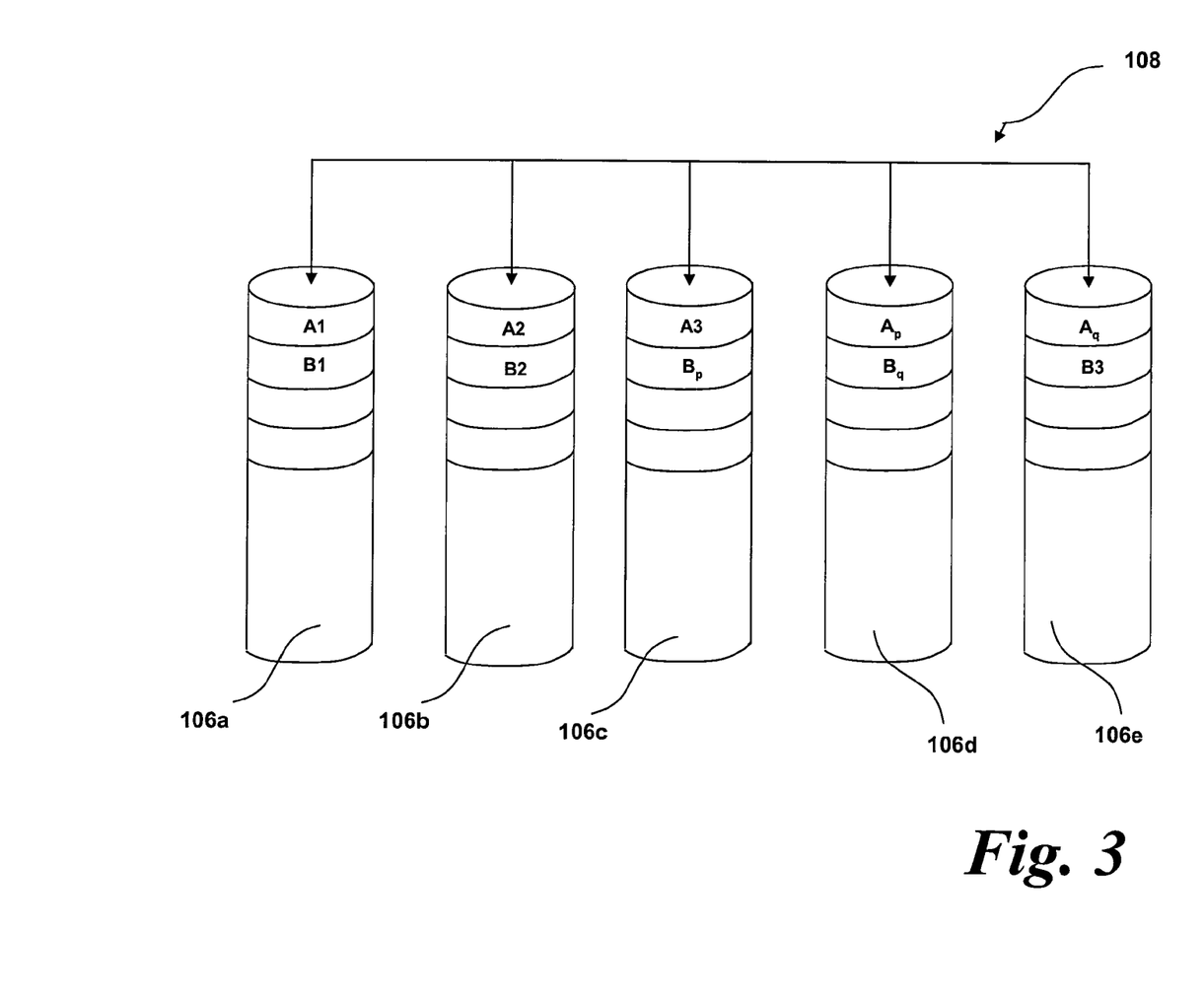
FIG. 3 is a schematic diagram of the mapping between storage sector indices in a RAID 6 arrangement.

The storage devices 106a-e forming the RAID 6 array 108 are shown in more detail in FIG. 3. Each storage device 106a-e comprises a hard disk drive generally of high capacity, for example, 1 TB. Each device 106a-e can be accessed by the host 102 through the RAID controller 104 to read/write data.

As shown in FIG. 3, data is stored on the RAID 6 array 108 in the form of stripe units. Each data stripe A, B comprises five separate stripe units—stripe A comprises stripes A1, A2, A3, $A_p$ and $A_q$. Stripe B comprises stripe units B1, B2, B3, $B_p$ and $B_q$. Therefore, the stripe units comprising each stripe (A1-A3 or B1-B3 respectively) are distributed across a plurality of disk drives, together with parity information $A_p$ and $A_q$ and $B_p$ and $B_q$ respectively. This provides data redundancy.

The following embodiment of the invention may be utilised with the above RAID arrangement. In the following description, for brevity, a single storage device 106a will be referred to. However, the embodiment of the invention is equally applicable to other arrangements; for example, the storage device 106a may be a logical drive, or may be a single hard disk drive.

Figure 4:
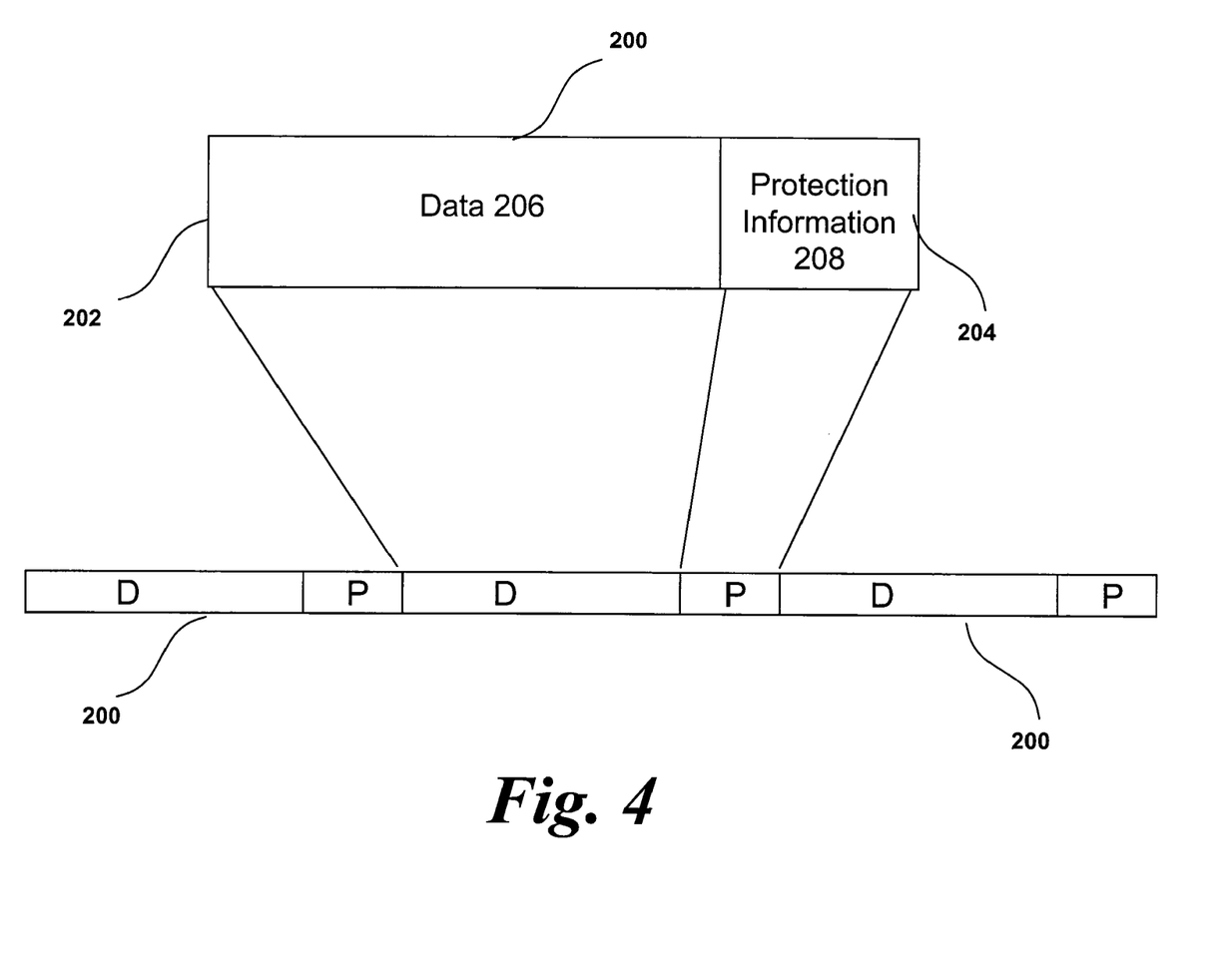
FIG. 4 is a schematic diagram of a sector amongst a plurality of sectors in a storage device.

FIG. 4 shows the format of a sector 200 of a storage device 106a. The sector 200 comprises a data field 202 and a protection information field 204. Depending upon the file system used, each sector 200 may correspond to a logical block.

As set out above, the term "storage device" in the context of the following description may refer to a logical drive which is formed on the RAID array 108. In this case, a sector refers to a portion of the logical drive created on the RAID array 108. The following embodiment of the present invention is applicable to any of the above described arrangements.

In this embodiment, the storage device 106 is formatted such that each sector 200 comprises 520 bytes (4160 bits). The data field 202, in this embodiment, is 512 bytes (4096 bits) long and the protection information field 204 is 8 bytes (64 bits) long.

The term "sector" used herein, whilst described in an embodiment with particular reference to 520 byte sector sizes, is generally applicable to any sector sizes. Therefore, the term "sector" is merely intended to indicate a portion of the storage availability on a storage device and is not intended to be limited to any of the disclosed examples. Additionally, sector may be used to refer to a portion of a logical drive, i.e. a virtual drive created from a plurality of physical hard drives linked together in a RAID configuration.

The data field 202 comprises user data 206 to be stored on the storage device 106a-e. This data may take any suitable form and, as described with reference to FIGS. 2 and 3, may be divided into a plurality of stripe units spread across a plurality of storage devices 106a-e. However, for clarity, the following description will focus on the data stored on a single storage device 106.

In a conventional storage device, the protection information field 204 may comprise ECC, CRC or parity bits. However, in the present invention, the protection information 208 to be stored in the protection information field 204 relates to the actual data stored in the data field 202 together with location information specifying the correct location of that data; i.e. which sector 200 and on which storage device 106 the data is (or should be) stored.

The protection information 208 in the protection information field 204 is generated in the following way. The following discussion will focus on a single storage device 106a. However, the skilled person would readily appreciate that the system, method and apparatus described below could be applied to a RAID array comprising data stripes, or any other type of distributed storage system.

A write request from the host 102 specifies both the data 206 to be written to the data field 202 of one or more sectors 200, plus routing (or identifying) information specifying the location of the one or more sectors 200. Each storage device 106a-e in the storage resource 100 is assigned a device target identifier $T_D$. This identifier may comprise any suitable form and identifies the hard disk drive in question.

For instance, non-exhaustive examples of suitable device target identifiers may be: a hash of the SAS address; WWN; serial number; a combination of the array identifier and member index; or an enumerated value assigned to the disk by software. In the present embodiment, the device target identifier $T_D$ comprises an 18-bit device identifier.

Each sector 200 is also assigned a logical address identifier $T_S$. This identifier may comprise any suitable form. For instance, non-exhaustive examples of suitable formats may be: the S least significant bits; the S most significant bits of the logical address of sector 200; to partition all the LBAs into $2^S$ regions and assign the logical address identifier be the LBA region number. In the present embodiment, the logical address identifier $T_S$ comprises an 18-bit address identifier.

Together, the device target identifier $T_D$ and logical address identifier $T_S$ comprise target identifying information T which identifies the sector 200 to which data is to be written.

To generate parity information 208 for the protection information field 204, the RAID controller 104 is configured to generate a message 250 from the data 206 and the identifying information T directed to sector 200. The format of the message 250 is shown in FIG. 5.

Figure 5:
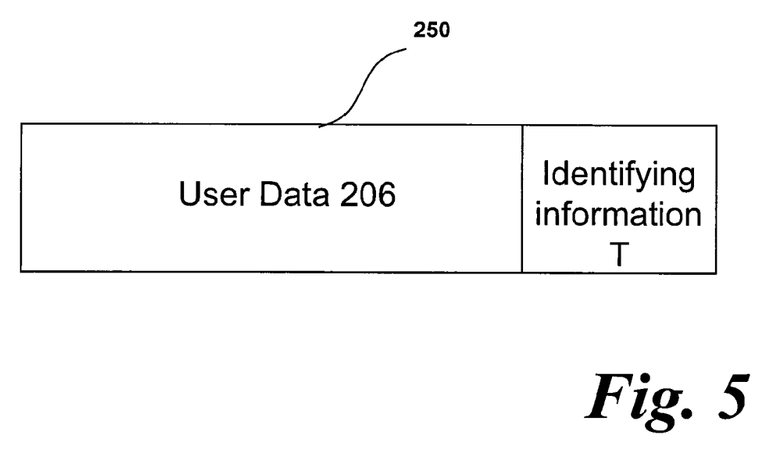
FIG. 5 is a schematic diagram of a message format according to an embodiment of the invention.

As shown in FIG. 5, the message 250 comprises the user data 206 intended to be written to a particular sector 200 having identifying information T (comprising device target identifier $T_D$ and logical address identifier $T_s$). Therefore, message 250 comprises M bits, where M is equal to the number of bits D of user data 206 and the number of bits T of identifying information T, or M=D+T. Since T=36 bits and D=4096 bits, M=4132 bits in this embodiment.

Figure 6:
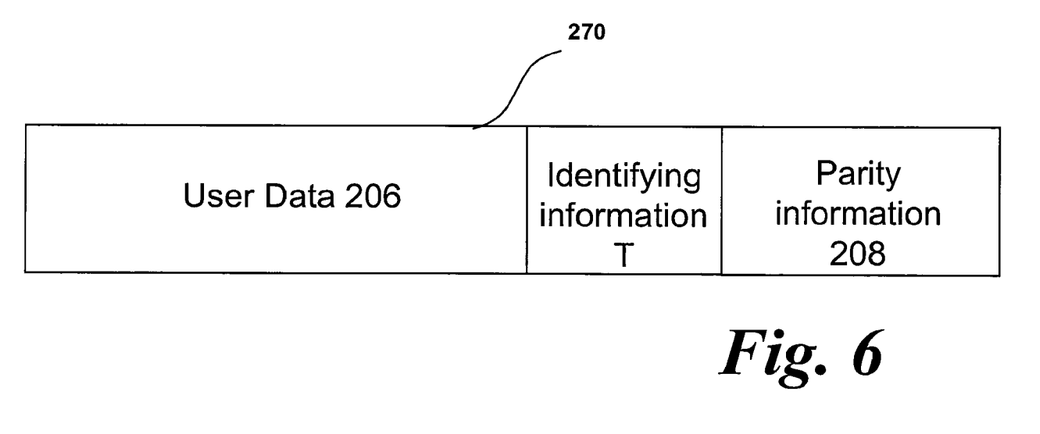
FIG. 6 is a schematic diagram of a codeword format according to an embodiment of the invention.

For each sector 200, the RAID controller 104 is arranged to generate a codeword 270 from the respective message 250. The codeword 270 is shown in FIG. 6 and comprises user data 206, identifying information T and parity information 208.

In other words, the codeword 270 comprises the message 250 (including the user data 206 and identifying information T (comprising device target identifier $T_D$ and logical address identifier $T_S$)) plus parity information 208 generated from the message 250.

The parity information 208 is generated by use of an error correcting code (ECC). Any suitable error correcting code may be used, provided that it meets certain criteria. Firstly, the ECC scheme must be systematic, i.e. it must not modify the message 250. Secondly, the scheme must produce p bits of parity information 208 (also known as redundant information or checksum data), where p must not be greater than the number of bits available in the protection information field 204 of a sector 200.

The codeword 270 is generated through use of Reed-Solomon coding applied to the message 250. Reed-Solomon codes are non-binary cyclic codes with symbols made up of m-bit symbols (where m is any positive integer having a value greater than 2). Reed-Solomon code on m-bit symbols exist for all n and k for which $$0 < k < n < 2^m + 2 \quad 1)$$

where k is the number of data symbols being encoded, and n is the total number of code symbols in the codeword 270, i.e. k+p (i.e., the message 250 plus parity information 208). The codeword 270 is the combination of message and parity symbols together.

For the most conventional Reed-Solomon (n, k) code, $$(n,k) = (2^m - 1, 2^m - 1 - p) \quad 2)$$

Therefore, the total symbol length of the codeword 270 is:

$$n \leq 2^m - 1 \quad 3)$$

And, concomitantly, the number of parity symbols p is defined by:

$$p = n - k. \quad 4)$$

As a further parameter, t is the symbol-error correcting capability of the code and, for a conventional Reed-Solomon code:

$$5)$$
$$t = \frac{p}{2}$$

As an example, RAID 6 provides an instance of Reed-Solomon coding where the symbol size m=8 bits. This value is chosen because a byte is 8 bits. In the RAID 6 arrangement, k corresponds to the number of data drives and the number of parity symbols p=2. All of the bytes at the same offset within each drive of an array is equivalent to the codeword.

Since bytes are 8-bits long, it is naturally desirable to set the symbol size to 8-bits so that each byte is one symbol. However, a codeword 270 so generated is limited in size to 255 symbols. However, the data 206 to be written to the data area 202 of a sector 200 already contains 512 bytes of user data 206, so there is insufficient room to include the 36 bits of identifying information T.

Consequently, in this embodiment, a larger symbol size is used and the user data 206 is organised into groups of 9-bit symbols (i.e. m=9). Given a 9-bit symbol, the codeword 270 size can be as large as $2^9 - 1$. Therefore, the codeword 270 may comprise 511 symbols.

As discussed, the user data 206 has a size of 512 bytes (4096 bits). In order to make this data fit the 9-bit symbol scheme, the user data 206 is padded with 8 bits of zero data to provide a total user data 206 volume of 4104 bits. This number of bits is evenly divisible by 9.

Consequently, the number of symbols of user data 206 is 456 i.e. 4104 bits/9. Since this is less than the maximum available 511 symbols, the use of 9-bit symbols enables all the user data 206 intended to be written to a sector 200 together with the identifying information T (comprising 36 bits) and generated parity information 208 to be provided in a single codeword 270.

Figure 7:
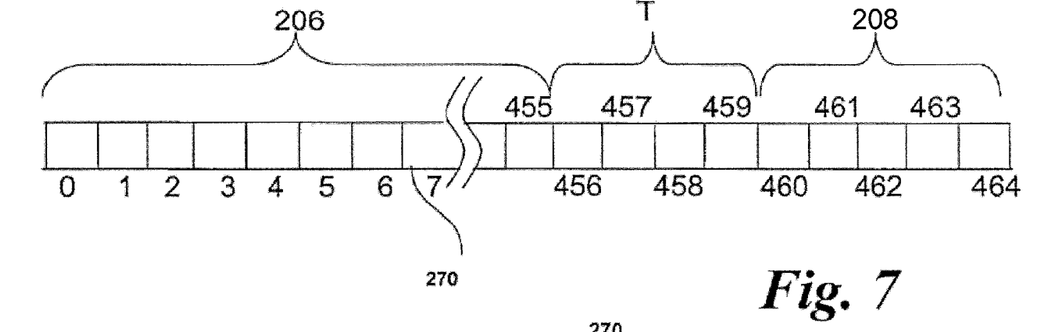
FIG. 7 is a schematic diagram of the symbols forming a codeword format according to an embodiment of the invention.

A codeword 270 thus generated is shown schematically in FIG. 7. Each symbol 0-464 comprises 9 bits of data. Symbols 0 to 454 comprise sequential blocks of 9 bits of the data 206 to be written to the data area 202 of a sector 200. Symbol 455 comprises the final bit (bit 4096) of the data 206, together with the 8 zero bits provided to "pad" the data 206. Therefore, symbols 0 to 455 comprise the entirety of the bits of the data 206 to be written to a single sector.

Symbols 456 and 457 contain the target drive identifier $T_D$ forming part of the identifying information T. Symbols 458 and 459 comprise the address identifier $T_S$ of the sector 200 forming the other part of the identifying information T.

Finally, symbols 460 to 464 comprise the generated parity information 208 generated through the use of the Reed-Solomon code.

Figure 8:
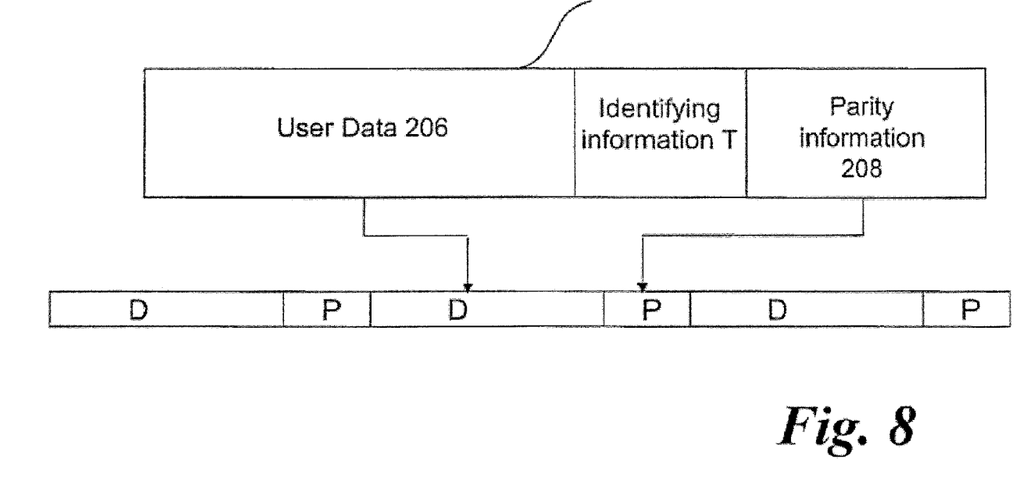
FIG. 8 is a schematic diagram of the codeword of FIG. 6 showing data transfer to a sector shown in FIG. 4.

Once the codeword 270 has been generated, the RAID controller 104 is configured to write data 206 held in symbols 0 to 455 to the data field 202 of the respective sector 200. Further, the parity information 208 generated by Reed-Solomon encoding is written into the protection information field 204 of the sector 200. This is shown in FIG. 8.

Since the parity information 208 is in the form of five 9-bit symbols (45 bits in total), this can easily be saved into 6 bytes (48-bits) of the available 8 bytes of the protection information field 204. This is particularly advantageous since this approach enables the T10 data integrity field (DIF) format to be supported on the side of the host 102 of the RAID controller 104.

The American National Standards Institute's (ANSI) T10 DIF specification calls for data to be written in blocks of 520 bytes. As part of this protocol, it is necessary to save two bytes of the protection information field 208 in order to store the T10 DIF application tag which is required to be written to each sector 200. The remaining six bytes are used to store parity generated by Reed-Solomon encoding of the user data and routing information.

The identifying information T is not required because the routing information is known to the RAID controller 104 firmware and does not need to be copied to the sector 200 data area.

The operation of a method according to the present invention will now be described with reference to FIGS. 9 and 10.

Figure 9:
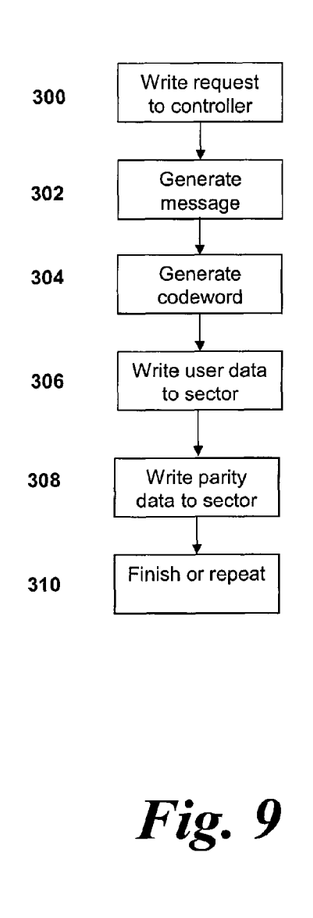
FIG. 9 is a flow diagram showing a write operation according to an embodiment of the present invention.

FIG. 9 shows a flow diagram of the method for writing data to the storage device 106a and protecting that data from silent data corruption. As previously discussed, the following discussion relates specifically to a single storage device 106a. However, the invention is equally applicable to a sector of a logical drive, or a RAID array of drives in which data is striped thereon.

Step 300: Write Request to Controller

At step 300, the host 102 generates a write request for a specific volume (e.g. storage device 106a) to which it has been assigned access rights. The request is sent via communication network 110 to the host ports (not shown) of the RAID controller 104. The write command is then stored in a local cache (not shown) forming part of the RAID controller hardware 120 of the RAID controller 104.

The RAID controller 104 is programmed to respond to any commands that request write access to the storage device 106a. The RAID controller 104 processes the write request from the host 102 and determines the target identifying address T of the sector 200 to which it is intended to write that data to. The target identifying address T comprises the device target identifier $T_D$ (which, in this embodiment, is 18-bytes in length) and the sector 200 logical address identifier $T_S$ (which is also 18 bytes in length in this embodiment).

In summary, the device target identifier $T_D$ identifies the particular storage device 106a amongst all the storage devices 106a-e and the sector 200 logical address identifier $T_S$ identifies the pertinent sector 200 amongst all of the sectors 200 forming the usable capacity of the storage device 106a. The method then proceeds to step 302.

Step 302: Generate Message

A message 250 is then generated. The format of the message 250 is shown in FIG. 7 and comprises the user data 206 intended to be written to a particular sector 200 having identifying information T (comprising device target identifier $T_D$ and logical address identifier $T_S$).

Therefore, message 250 comprises M bits, where M is equal to the number of bits D of user data 206 and the number of bits T of identifying information T, or M=D+T. Since T=36 bits and D=4096 bits, M=4132 bits in this embodiment.

The method then proceeds to step 304.

Step 304: Generate Codeword

For each sector 200, the RAID controller 104 utilises the message 250 to generate a codeword 270. The codeword 270 is shown in FIGS. 6 and 7 and comprises user data 206, identifying information T and parity information 208.

In other words, the codeword 270 comprises the message 250 (including the user data 206 and identifying information T (comprising device target identifier $T_D$ and logical address identifier $T_S$)) plus parity information 208 generated from the message 250.

The RAID controller 104 utilises a Reed-Solomon code is used to generate the parity information 208. The user data 206 is organised into groups of 9-bit symbols. Since the user data 206 has a size of 512 bytes (4096 bits), the user data 206 is padded with 8 bits of zero data to provide a total user data 206 volume of 4104 bits, which is split into 456 symbols. Another four symbols are used to store the target drive identifier $T_D$ and the address identifier $T_S$ forming the identifying information T.

From the user data 206 and identifying information T, the RAID controller 104 generates parity information 208 through the use of the Reed-Solomon code. Once the codeword 270 has been generated, the method proceeds to step 306.

Step 306: Write User Data to Sector

At step 308, the data 206 is written to the data area 202 of the respective sector 200.

The data area 202 comprises 512 bytes, or 4096 bits. The bits of data 206 comprising part of the codeword 270 in 9-bit format symbol format are written to the data area 202 of the sector 200. The eight zero values entered as "padding" are ignored and not written to the data area 202 since these values do not comprise part of the original data 206.

The method then proceeds to step 308.

Step 308: Write Parity Information to Sector

The parity information 208 generated in step 304 is then written to the protection information field 204 of the sector 200.

The protection information field 204 comprises 8 bytes (64 bits) of available space for the parity information 208. The parity information 208 generated in step 306 comprises 5 symbols of 9 bits each—a total of 45 bits. Consequently, the parity information 208 can be written to the protection information field 204 comfortably within 6 bytes. The remaining two bytes may, optionally, be reserved for a T10 DIF application tag assigned to each sector 200.

The method then proceeds to step 310.

Step 310: Finish or Repeat

At step 310, the writing of the data 206 together with parity information 208 is complete. The method may then proceed back to step 300 for further sectors 200 or may terminate.

Figure 10:
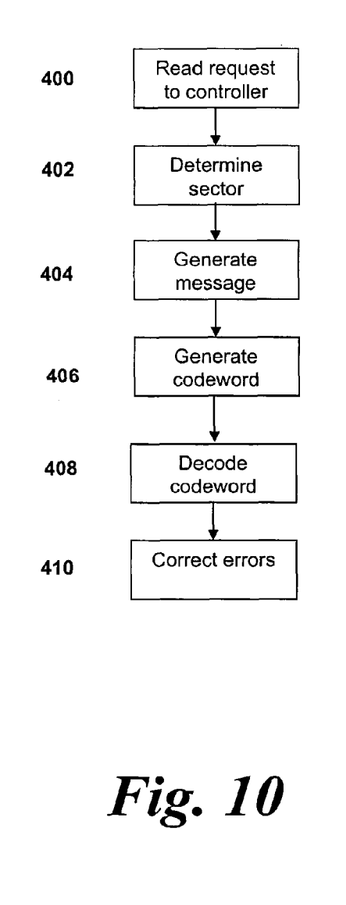
FIG. 10 is a flow diagram showing a read operation according to an embodiment of the present invention.

FIG. 10 shows a flow diagram of the method for reading data from the storage device 106*a* which enables silent data corruption to be detected. As previously discussed, the following discussion relates specifically to a single storage device 106*a*. However, the invention is equally applicable to a sector of a logical drive, or a RAID array of drives in which data is striped thereon.

Step 400: Read Request to Controller

At step 300, the host 102 generates a read request for the primary storage device 106 to which it has been assigned access rights. The request is sent via the communication network 110 to the host ports (not shown) of the RAID controller 104. The read command is then stored in a local cache (not shown) forming part of the RAID controller hardware 120 of the RAID controller 104.

Step 402: Determine Sector of Storage Device

The RAID controller 104 is programmed to respond to any commands that request read access to the storage device 106*a*. The RAID controller 104 processes the read request from the host 102 and determines the sector(s) of the storage device 106*a* in which the data is stored. The method then proceeds to step 404.

Step 404: Generate Message

Figure 11:
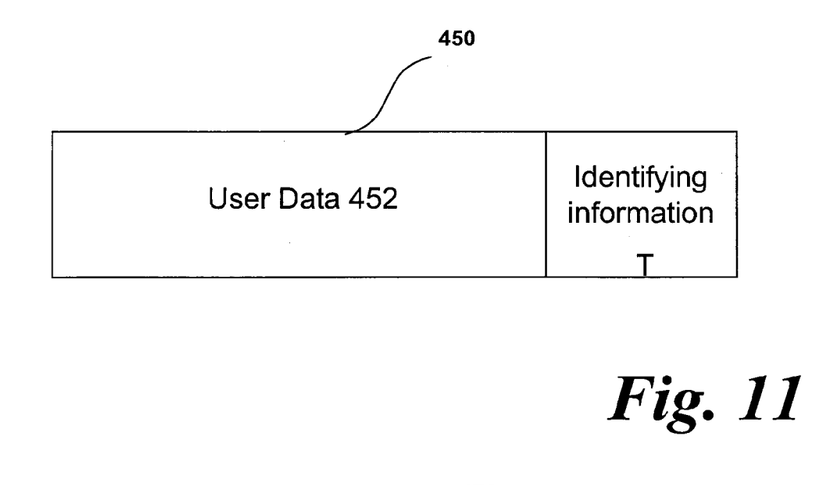
FIG. 11 is a schematic diagram of a message format according to a read operation of the present invention.

At step 404, a message 450 is generated. The message 450 is shown in FIG. 11. The message 450 is similar in composition to the message 250 described previously. However, the message 450 is constructed from the existing stored data 452 retrieved from the data area 202 of the sector 200 in question, together with identifying information 454 (i.e. target device identifier $T_D$ concatenated with the logical address identifier $T_S$) supplied by the RAID controller 104 in response to the read direction determined in step 402. Once the message 450 is constructed, the method proceeds to step 406.

Step 406: Generate Codeword

Figure 12:
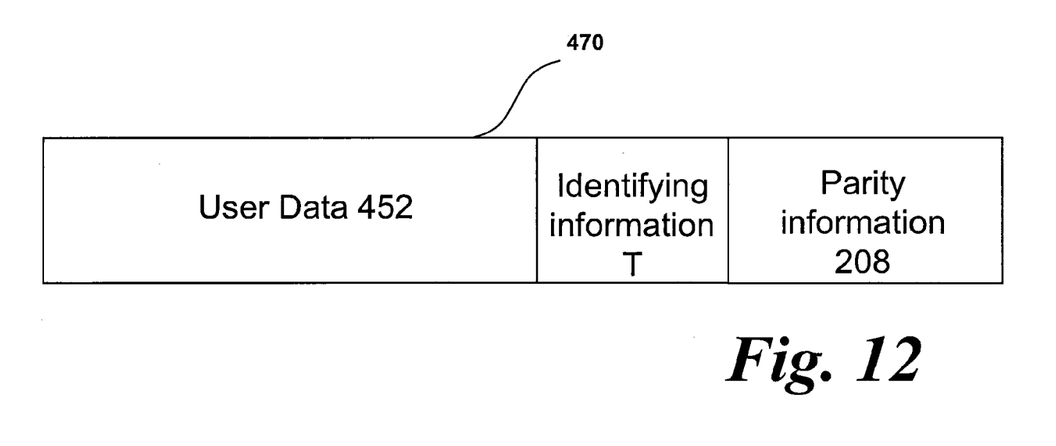
FIG. 12 is a schematic diagram of a codeword format according to a read operation of the present invention.

For each sector 200 to be read, the RAID controller 104 utilises the message 450 to generate a codeword 470. The codeword 470 is shown in FIG. 12 and is similar in format to the codeword 270 described previously.

The codeword 470 comprises the message 450 generated in step 404 together with the parity information 208 retrieved from the protection information field 204 of the sector 200. Therefore, the codeword 470 comprises the user data 452 read from the data area 202 of the sector 200, together with identifying information T (comprising device target identifier $T_D$ and logical address identifier $T_S$)) forming part of the read request and the parity information 208 written to the sector 200 in step 308.

The method then proceeds to step 408.

Step 408: Decode Codeword

In step 408, the RAID controller 104 decodes the codeword 470 using the ECC scheme (in this embodiment, Reed-Solomon coding). The codeword 470 is checked for consistency.

If no decode error is detected following the decoding at step 408, the user data 452 is assumed to be correct and in the correct location.

Alternatively, if an error is detected, the sector 200 is first read again to ensure the error is not transient. If the error is not transient, the method proceeds to step 410.

Step 410: Correct Errors

If, at the error checking step 410, a correctable error in the data 452 or the parity information 454 portions of the codeword 470 is detected, the data stored in the sector 200 in question can be updated with the correct information.

However, if the error checking step 408 detects a correctable error in the identification information portion T of the message 450, a mis-direction has occurred. In this instance, the error correction coding (in this embodiment, Reed Solomon coding) can correct the codeword 470.

From the corrected codeword 470, the RAID controller 104 software or firmware can determine where the previously misdirected write was intended to go. The RAID controller 104 firmware or software then re-submits the previously misdirected write to the correct location.

As an example based on the described embodiment, the Reed-Solomon decoding will correct the message 450 and identify where the original write was intended to go. For example, take the situation the write request was targeted at a physical drive having ID 0x1234, but instead was misdirected to target physical drive having ID 0x5555.

When the sector on physical drive ID 0x5555 is read, the codeword 470 will be decoded and determined to be corrupt. Consequently, the identifying information T will be corrected to refer to the correct physical drive having ID 0x1234. The user data 452 is then written to the correct drive whose ID is 0x1234 and the drive whose ID is 0x5555 can be rebuilt.

Additional corrective actions may also be taken. For example, the chunk where data corruption occurred due to misdirection can be rebuilt. Alternatively, in the case of a RAID array, data can be synchronised with parity for all stripe units affected by the identified misdirection. As a further step, all stripe units in the target address region of the affected drive affected by the misdirection can be verified.

Variations of the above embodiments will be apparent to the skilled person. The precise configuration of hardware and software components may differ and still fall within the scope of the present invention.

For example, the present invention has been described with reference to controllers in hardware. However, the controllers and/or the invention may be implemented in software. This can be done with a dedicated core in a multi-core system. Given a proper software algorithm, it should be feasible to calculate protection information in parallel with array parity so that each piece of user data is read only once.

Additionally, whilst the present embodiment relates to arrangements operating predominantly in off-host firmware or software (e.g. on the RAID controller 104), an on-host arrangement could be used.

Further, alternative ECC methods could be used. The skilled person would be readily aware of variations which fall within the scope of the appended claims.

Alternatively, if Reed-Solomon coding is used, symbols other than 9-bit symbols could be used. The skilled person would be readily aware of the different symbol sizes that could be used with the present invention. For example, symbols having greater than 8 bits would be suitable for use with the present invention.

Embodiments of the present invention have been described with particular reference to the examples illustrated. While specific examples are shown in the drawings and are herein described in detail, it should be understood, however, that the drawings and detailed description are not intended to limit the invention to the particular form disclosed. It will be appreciated that variations and modifications may be made to the examples described within the scope of the present invention.

The invention claimed is:

1. A method comprising:
    providing data to be written to an intended sector of a data storage device;
    generating, for the intended sector, a message comprising the data to be written to the intended sector and identifying information for the intended sector, the identifying information identifying a location of the intended sector and comprising a device identifier address and a sector logical address;
    performing, on the message, error correcting encoding to generate parity information derived from the data and the identifying information;
    generating a codeword comprising the message and the parity information generated from the error correcting coding, the codeword arranged as N-bit symbols with N greater than eight;
    writing the data to a data field of the intended sector; and
    writing the parity information to a protection information field of the sector.

2. The method of claim 1, wherein the error correcting coding comprises Reed-Solomon encoding.

3. The method of claim 1, wherein the codeword comprises a first plurality of the N-bit symbols relating to user data, a second plurality of the N-bit symbols relating to the identifying information and a third plurality of the N-bit symbols relating to the parity information.

4. The method of claim 1, wherein the data to be written to the intended sector have a first total number of bits not an integral multiple of N, and wherein filler bits are appended to the data to provide a second total number of bits that is an integral multiple of N.

5. The method of claim 1, wherein N is equal to nine.

6. A method comprising:
    executing a read request to read user data from a user data field of a sector of a data storage device, the sector having identifying information which identifies a location of the sector, the identifying information comprising a specified device identifier address and sector logical address;
    generating a message comprising the user data read from the user data field and the identifying information associated with the sector;
    reading parity information from a protection information field of the sector, the parity information being originally derived from the user data in the sector and the sector that the user data was intended to be written to during execution of a previous write request;
    generating a codeword comprising the message and the parity information, the codeword arranged as a plurality of N-bit symbols with N being greater than eight; and
    performing, on said codeword, error correcting decoding such that said codeword is checked for errors.

7. The method of claim 6, wherein said error correcting coding comprises Reed-Solomon encoding.

8. The method of claim 7, wherein the codeword comprises a first plurality of symbols relating to the user data, a second plurality of symbols relating to identifying information of the intended sector and a third plurality of symbols relating to the parity information.

9. The method of claim 7, wherein the device identifier address is arranged as a first integral number of the N-bit symbols, and the sector logical address is arranged as a second integral number of the N-bit symbols.

10. The method of claim 9, where N is equal to nine.

11. The method of claim 6, wherein if, during the step of performing error detecting decoding, at least one error in the user data of the message is detected, the method further comprises correcting the user data in the data field of the sector.

12. The method of claim 6, wherein if, during the step of performing error detecting decoding, at least one error in the identifying information of the message is detected, the method further comprises correcting the identifying information and writing the user data in a data field of a sector having the correct identifying information.

13. An apparatus comprising a controller coupled to a data storage device, the controller comprising a processor and corresponding memory which stores programming instructions which, when executed by the processor, operate to:

provide data to be written to an intended sector of the storage device, the intended sector comprising a data field and a protection information field and having identifying information identifying the location of the sector, the identifying information comprising a device identifier address and a sector logical address; generate, for the intended sector, a message comprising the data to be written to the intended sector and the identifying information of the intended sector; perform, on the message, error correcting encoding to generate parity information derived from the data and the identifying information of the intended sector; generate a codeword comprising the message and the parity information generated from the error correcting coding, the code word arranged as a plurality of symbols each having a total of N bits where N is at least nine bits; write the data to the data field of the sector; and write the parity information to the protection information field of the sector.

14. The apparatus of claim 13, wherein the error correcting encoding comprises Reed-Solomon encoding.

15. The apparatus of claim 14, wherein the codeword comprises a first plurality of symbols relating to user data, a second plurality of symbols relating to the identifying information and a third plurality of symbols relating to the parity information.

16. The apparatus of claim 14, further comprising a plurality of storage devices coupled to the controller, each of the storage devices having a different device identifier address.

17. The apparatus of claim 13, where N is equal to nine.

18. The apparatus of claim 13, the controller characterized as a RAID controller.

19. The apparatus of claim 13, further comprising a plurality of storage devices coupled to the RAID controller across which data are stored in the form of RAID stripe units.

20. The apparatus of claim 19, further comprising a plurality of storage devices coupled to the controller, each of the storage devices having a different device identifier address.

21. An apparatus comprising a controller coupled to a data storage device, the controller comprising a processor and corresponding memory which stores programming instructions which, when executed by the processor, operate to read data from a sector of the storage device, the sector comprising a data field and a protection information field and having identifying information identifying the location of the sector, the identifying information comprising a device identifier address and a sector logical address, the programming instructions further operable to: execute a read request for reading of data from a selected sector having a specified device identifier address and sector logical address; read data from the data field of the selected sector; generate a message comprising the data read from the selected sector and the identifying information of the selected sector; read parity information from the protection information field of the selected sector, the parity information being originally derived from both the data in the selected sector and the sector that the data was intended to be written to; generate a codeword comprising the message and the parity information; and perform, on the codeword, error correcting decoding to check the codeword for errors, the codeword arranged as a plurality of N-bit symbols where N is equal to or greater than nine.

22. The apparatus of claim 21, wherein the error correcting coding comprises Reed-Solomon encoding.

23. The apparatus of claim 22, wherein the codeword comprises a first plurality of symbols relating to user data, a second plurality of symbols relating to the identifying information and a third plurality of symbols relating to the parity information.

24. The apparatus of claim 21, where N is equal to nine.

25. The apparatus of claim 21, the controller characterized as a RAID controller.

* * * * *